(12) United States Patent
Takahashi

(10) Patent No.: US 7,675,785 B2
(45) Date of Patent: Mar. 9, 2010

(54) SEMICONDUCTOR STORAGE DEVICE (75) Inventor: Hiroyuki Takahashi, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 392 days.

(21) Appl. No.: 11/717,666

(22) Filed: Mar. 14, 2007

(65) Prior Publication Data

US 2007/0215925 A1   Sep. 20, 2007

(30) Foreign Application Priority Data

Mar. 17, 2006   (JP) .............................. 2006-075370

(51) Int. Cl.
G11C 11/34   (2006.01)
(52) U.S. Cl. .................. 365/185.27; 365/104; 257/296
(58) Field of Classification Search ............ 365/185.27, 365/104, 149, 173, 154, 63, 69, 72, 189.03; 257/296
See application file for complete search history.

(56) References Cited

U.S. PATENT DOCUMENTS 6,791,862 B2 *   9/2004   Salling et al. ............... 365/145

2005/0078546 A1 *   4/2005   Hirano et al. ............... 365/232

FOREIGN PATENT DOCUMENTS

JP   6-37281   2/1994
JP   11-17134   1/1999

* cited by examiner

*Primary Examiner*—Dang T Nguyen
(74) *Attorney, Agent, or Firm*—Young & Thompson (57) ABSTRACT

There is provided a semiconductor storage device including a substrate area, a first and a second isolation area, a first well area where the first transistor is placed, a second well area where the second transistor to output a first voltage to bring the first transistor into non-conduction is placed, and a third well area where the third transistor to output a second voltage to bring the first transistor into conduction is placed. The second and third well areas and the second isolation area are formed between two of the first well area, the second isolation area is formed between the second well area and one of the first well area, and the third well area is formed between the second well area and another one of the first well area.

6 Claims, 11 Drawing Sheets

RELATED ART

RELATED ART

Fig. 8

RELATED ART

SEMICONDUCTOR STORAGE DEVICE

BACKGROUND OF THE INVENTION

1. Field of the Invention

The present invention relates to semiconductor storage devices and more particularly to a semiconductor storage device in which a cell array and a word driver are formed on isolate wells.

2. Description of Related Art

A semiconductor storage device (which is referred to hereinafter as a memory) is used as a storage device in various equipment. There is a strong need for a memory used in portable devices to exhibit low power consumption. However, as the manufacturing process of semiconductor elements constituting a memory is shifted to finer design rules, leakage current of semiconductor elements increases to result in higher power consumption. Further, the increase in leakage current requires increasingly frequent refresh operation for DRAM (Dynamic Random Access Memory) to maintain memory, which further increases power consumption.

In order to reduce the leakage current, a back-gate voltage VBB to be applied to a back gate of a gate transistor of a memory cell is set to a lower voltage (i.e. a negative voltage) than a substrate voltage (which is typically a ground voltage). A technique to set a back-gate voltage VBB to be lower than a substrate voltage is disclosed in Japanese Unexamined Patent Publication No. 6-37281 (referred to hereinafter as the related art 1).

Figure 5:
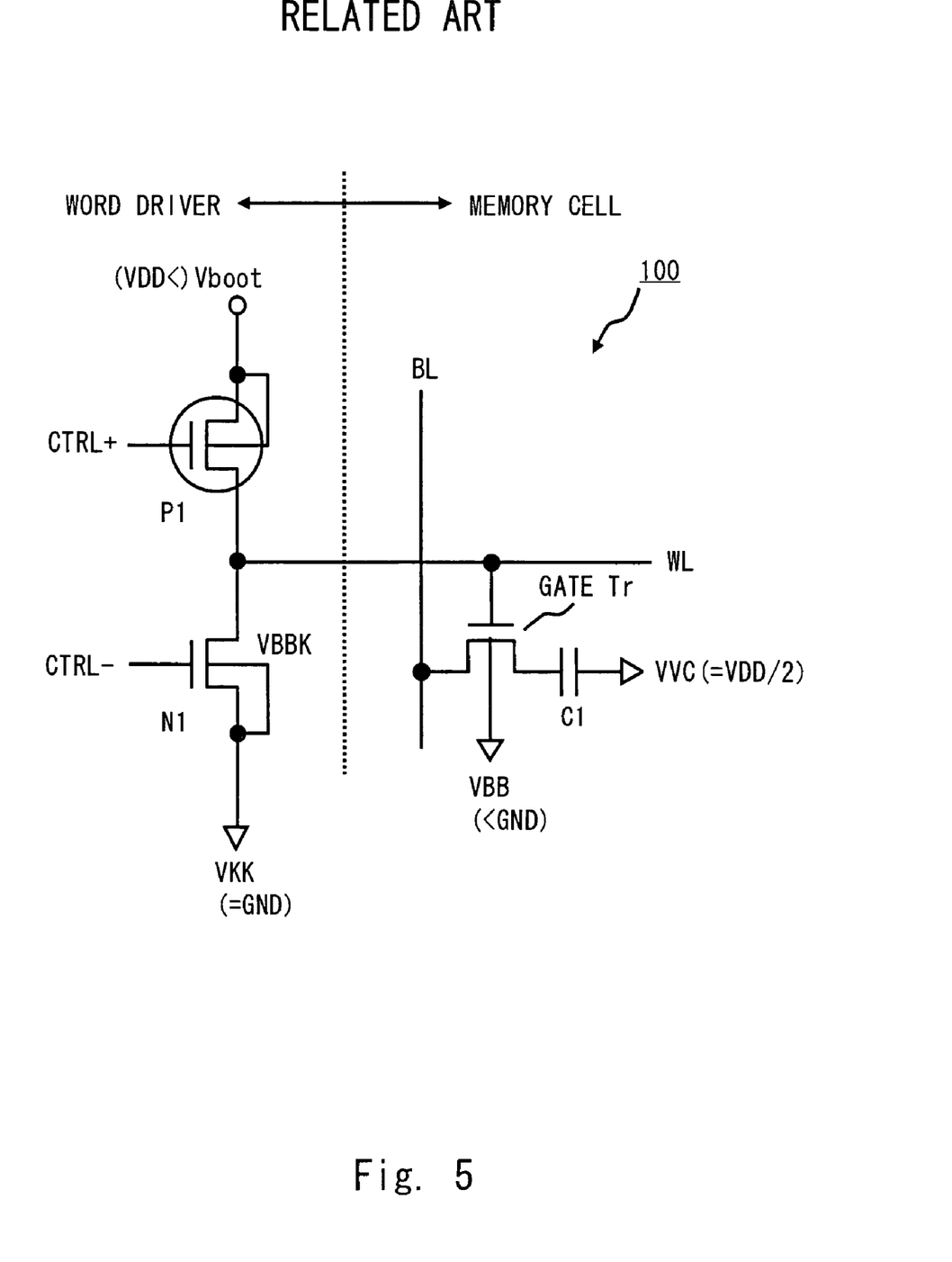
FIG. 5 is a circuit diagram of a memory according to the related art 1.

FIG. 5 is a circuit diagram of a memory according to the related art 1. As shown in FIG. 5, a memory 100 of the related art 1 includes word drivers to drive memory cells disposed in a word driver area 111 and memory cells to store data disposed in a cell array 110. In the word driver, a PMOS transistor P1 and an NMOS transistor N1 are connected in series between a drive voltage Vboot and a charge retention voltage VKK. Control signals CTRL with opposite logic levels to each other are input to the PMOS transistor P1 and the NMOS transistor N1, respectively. The drain of the PMOS transistor P1 and the drain of the NMOS transistor N1 are connected at a node, to which a word line WL is connected. In response to the control signals CTRL, the word driver supplies the drive voltage Vboot to the word line when writing or reading data and supplies the charge retention voltage VKK to the word line WL when holding data. The drive voltage Vboot is higher than the power supply voltage VDD, and the charge retention voltage VKK equals the ground voltage GND.

The memory cell includes a gate transistor and a capacitor C1. The gate transistor may be an NMOS transistor. The gate of the gate transistor is connected to the word line WL, and the drain is connected to a bit line BL. The source of the gate transistor is connected to a reference voltage VVC (e.g. VDD/2) through the capacitor C1. A back-gate voltage VBB of the gate transistor, which is a voltage of a well where the NMOS transistor is formed, is set to a negative voltage that is lower than the ground voltage GND. The bit line BL is connected to a sense amplifier (not shown) and the charge of the capacitor C1 is output from the sense amplifier through the bit line BL.

Data is written to or read from the memory cell by bringing the gate transistor into conduction according to the voltage of the word line WL. The charges accumulated in the capacitor are maintained by bringing the gate transistor into non-conduction.

Figure 6:
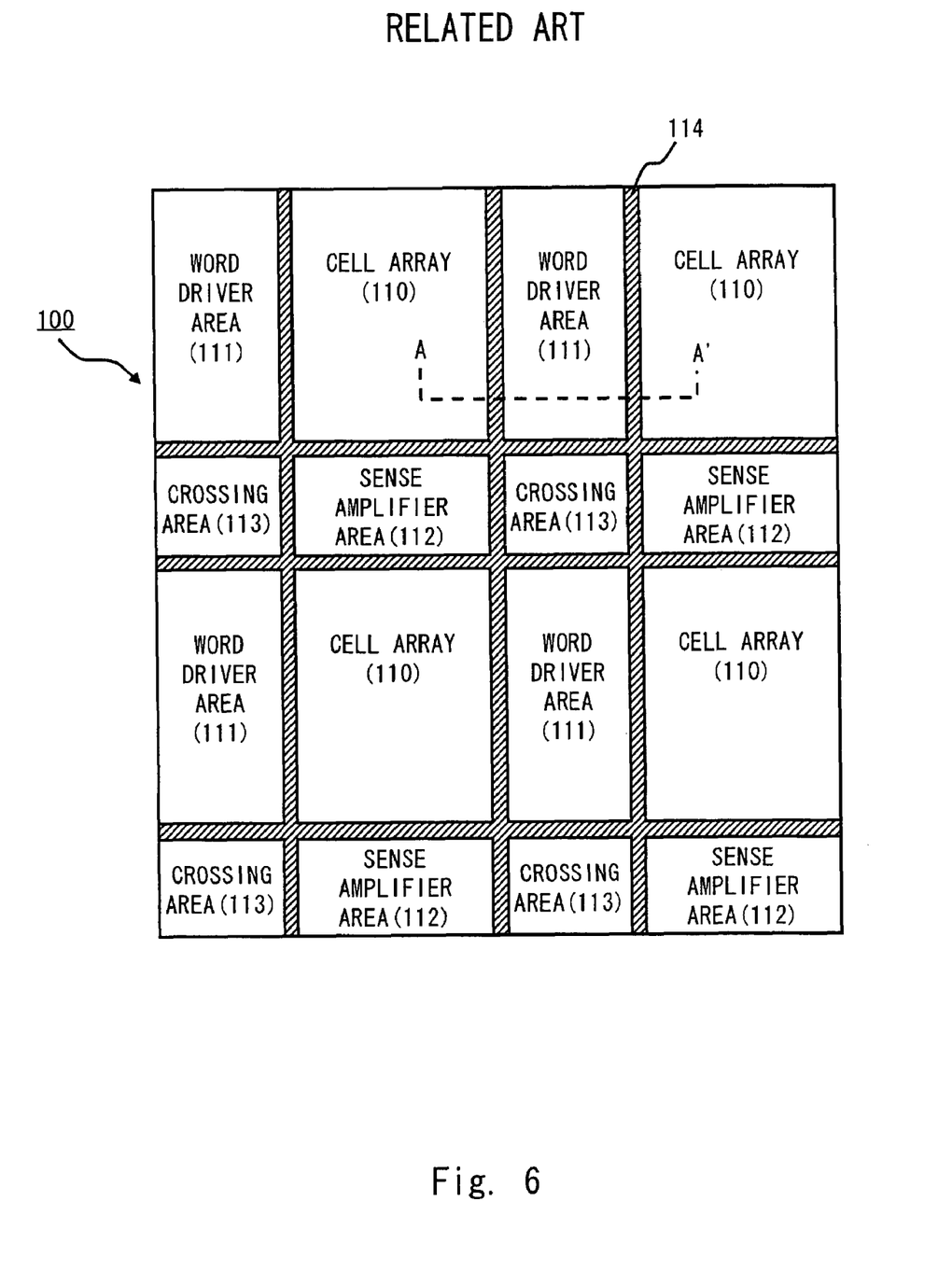
FIG. 6 is a view showing a block layout of the memory according to the related art 1.

FIG. 6 shows a schematic diagram of a block layout of the memory 100. As shown in FIG. 6, the memory 100 of the related art 1 includes a cell array 110 where a plurality of memory cells are placed, a word driver area 111 where a plurality of word drivers are placed, a sense amplifier area 112 where a plurality of sense amplifiers are placed, and a crossing area 113 where a junction circuit to transfer a control signal from a controller (not shown) to the word drivers and the sense amplifiers is placed. The cell array 110, the word driver area 111, the sense amplifier area 112 and the crossing area 113 are isolated by a isolation area 114. The cell array 110, the word driver area 111, the sense amplifier area 112 and the crossing area 113 constitute one array set, and a plurality of array sets are arranged in a lattice pattern in the memory 100 of the related art 1.

Figure 7:
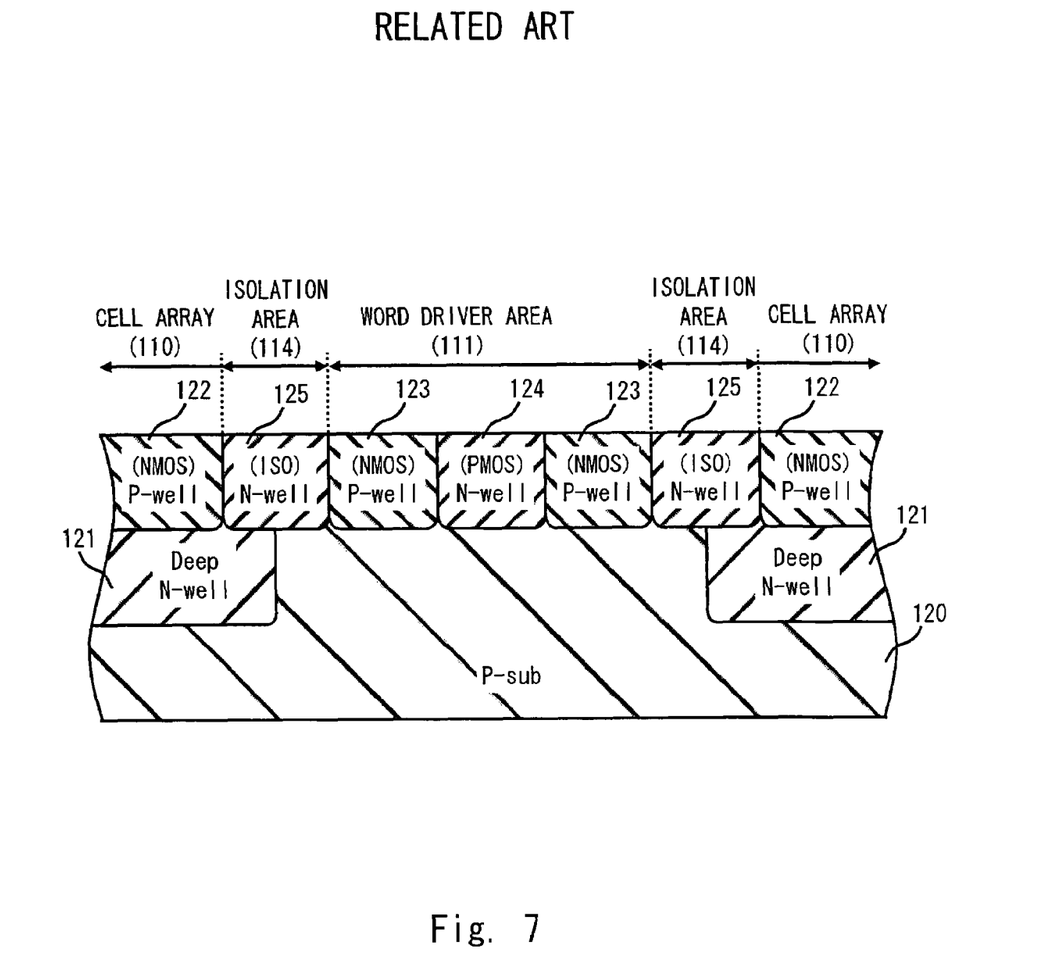
FIG. 7 is a cross-sectional view of the block layout along line A-A' in FIG. 6.

FIG. 7 is a cross-sectional view of the memory 100 along line A-A' in FIG. 6. As shown in FIG. 7, in the memory 100, a deep N-well area 121 formed of an N-type semiconductor is placed in an upper layer of a substrate area P-sub 120 formed of a P-type semiconductor. A P-well area 122 where a cell array is formed is placed in an upper layer of the deep N-well area 121. In the upper layer of the deep N-well area 121 is also placed a part of an N-well area 125 to serve as the isolation area 114 in the vicinity of the P-well area 122 where a cell array is formed. The word driver area 111 is placed between the adjacent isolation areas 114. The word driver area 111 is formed in a well that is formed in the upper layer of the substrate area P-sub 120. For example, a P-well area 123 where an NMOS transistor is placed adjacent to the isolation area 114, and an N-well area 124 where a PMOS transistor is formed is placed between the P-well areas 123.

In the memory of the related art 1, the P-well area 122 where the cell array 110 is formed is isolated from the substrate area P-sub 120 and the word driver area 111 by the N-well areas 121 and 125, so that the back-gate voltage VBB of the gate transistor of the memory cell is a negative voltage.

Figure 8:
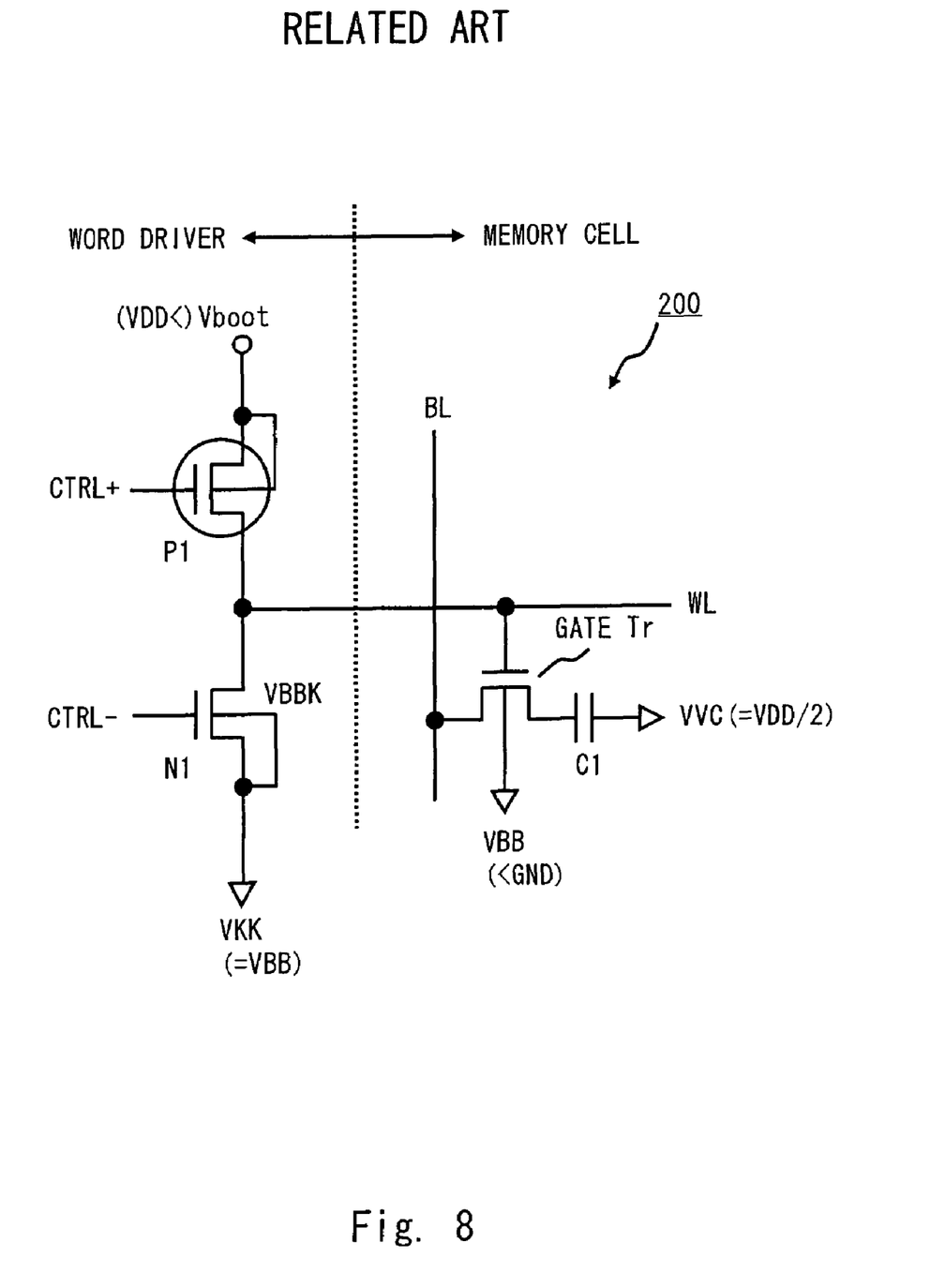
FIG. 8 is a circuit diagram of a memory according to the related art 2.

A technique of reducing the layout area of the memory 100 of the related art 1 by reducing the isolation area 114 is disclosed in Japanese Unexamined Patent Publication No. 11-17134 (referred to hereinafter as the related art 2). FIG. 8 shows a circuit diagram of a memory 200 according to the related art 2. The memory 200 is substantially the same as the memory 100 except that the charge retention voltage VKK of the memory driver 200 connected to the word driver equals the back-gate voltage VBB while the charge retention voltage VKK equals the ground voltage GND in the memory 100.

Figure 9:
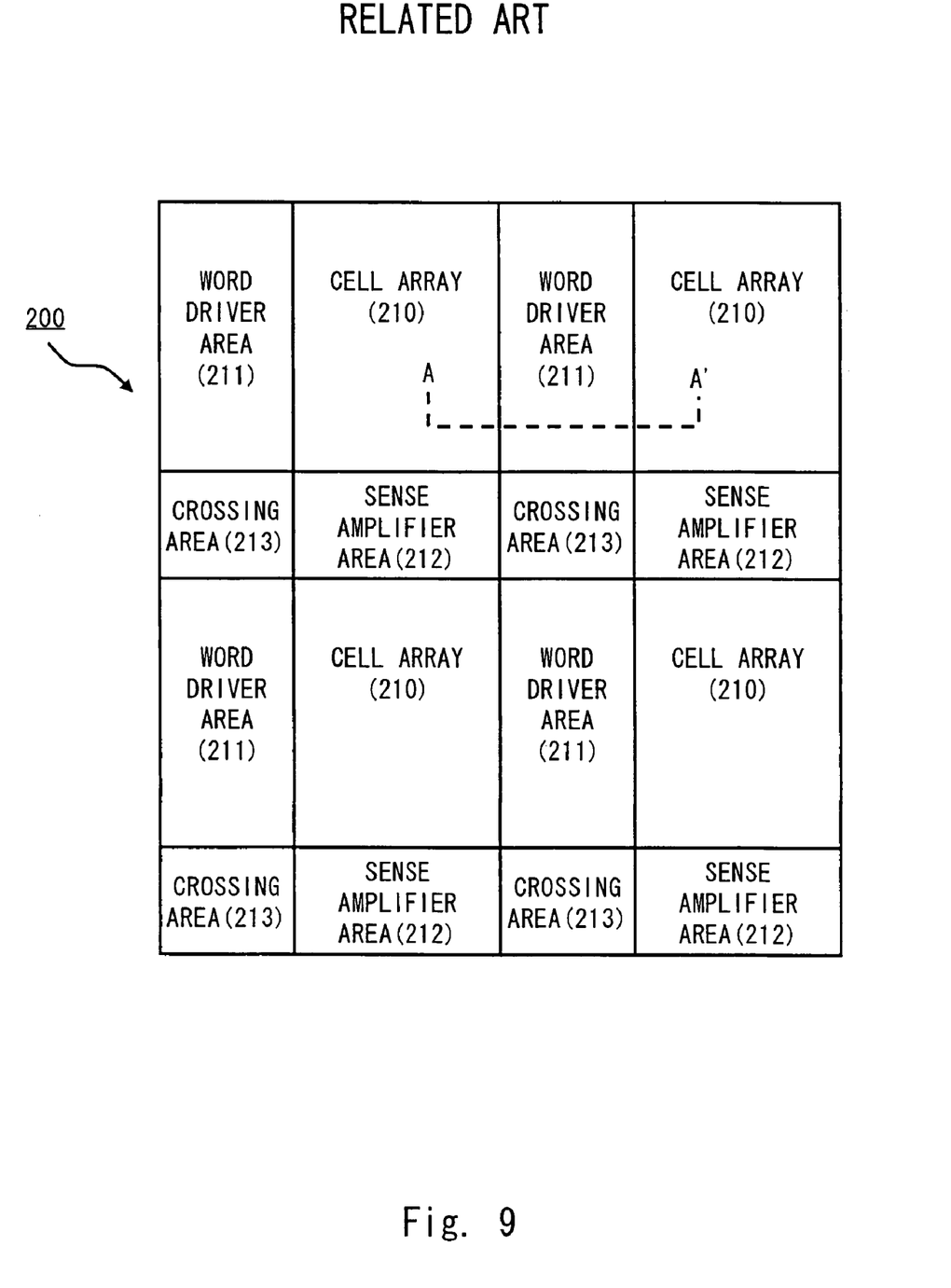
FIG. 9 is a view showing a block layout of the memory according to the related art 2.
Figure 10:
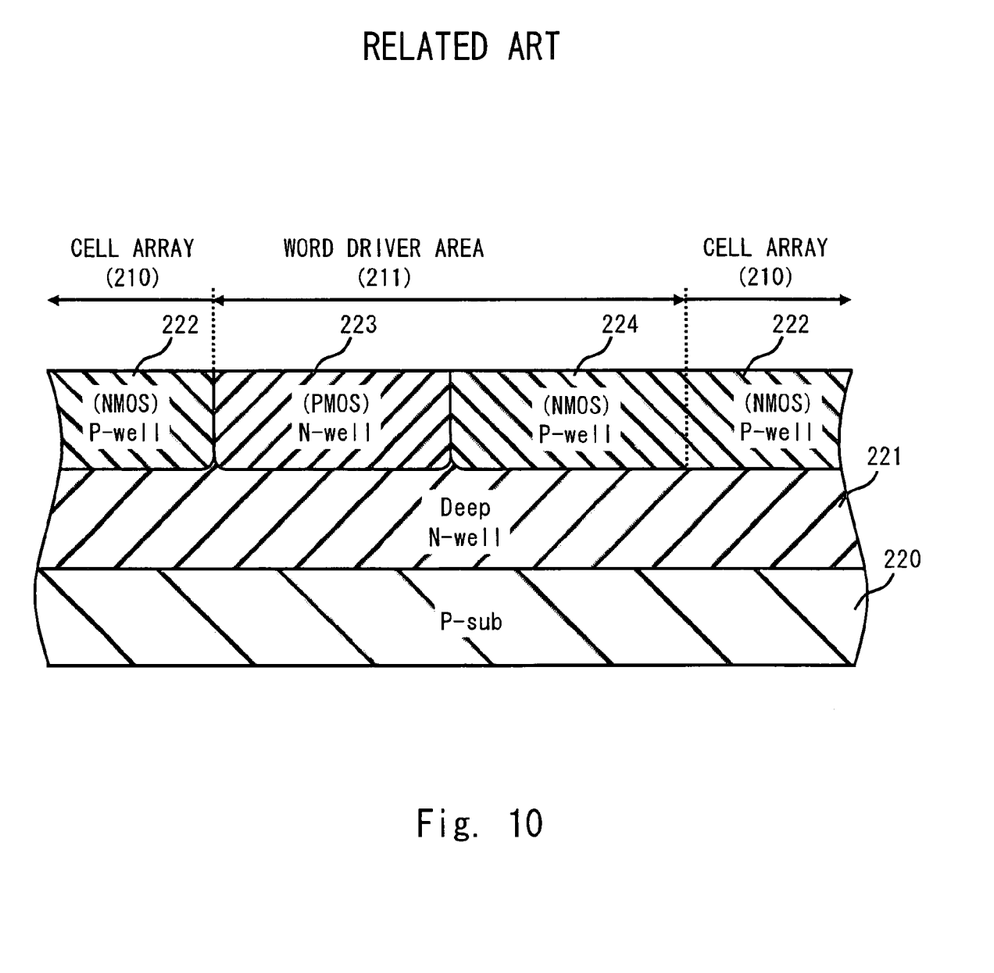
FIG. 10 is a cross-sectional view of the block layout along line A-A' in FIG. 9.

FIG. 9 shows a schematic diagram of a block layout of the memory 200 according to the related art 2. As shown in FIG. 9, in the memory 200, a cell array 210, a word driver area 211, a sense amplifier area 212 and a crossing area 213 are arranged without a isolation area interposed therebetween. FIG. 10 is a cross-sectional view along line A-A' in FIG. 9.

As shown in FIG. 10, in the memory 200, a deep N-well area 221 is placed in an upper layer of a substrate area P-sub 220 formed of a P-type semiconductor. The cell array 210 and the word driver area 211 are placed in an upper layer of the deep N-well area 221. In the cell array 210 and the word driver area 211, an N-well area 223 where a PMOS transistor of the word driver area is formed is placed adjacent to a P-well area 222 where one cell array 210 is formed. A P-well area 224 where an NMOS transistor of the word driver area 211 is formed is integrated with a P-well area 222 where another cell array 210 is formed.

In the memory 200, one cell array 210 and the word driver area 211 are insulated from each other with the semiconductors having opposite polarities placed adjacently, and the other cell array 210 and the word driver area 211 are connected without a isolation area with the semiconductors having the same polarity placed adjacently. Such a layout achieves the reduction of a chip area while setting the back-gate voltage VBB of the cell array 210 to a negative voltage.

However, if the gate transistor of the memory cell is designed to be finer, leakage current flows even when the gate voltage of the gate transistor is set to the ground voltage GND to bring the transistor into non-conduction. An increase in the leakage current degrades the charge retention characteristics of the memory cell to require increasingly frequent refresh operation, which leads to higher power consumption.

Figure 11:
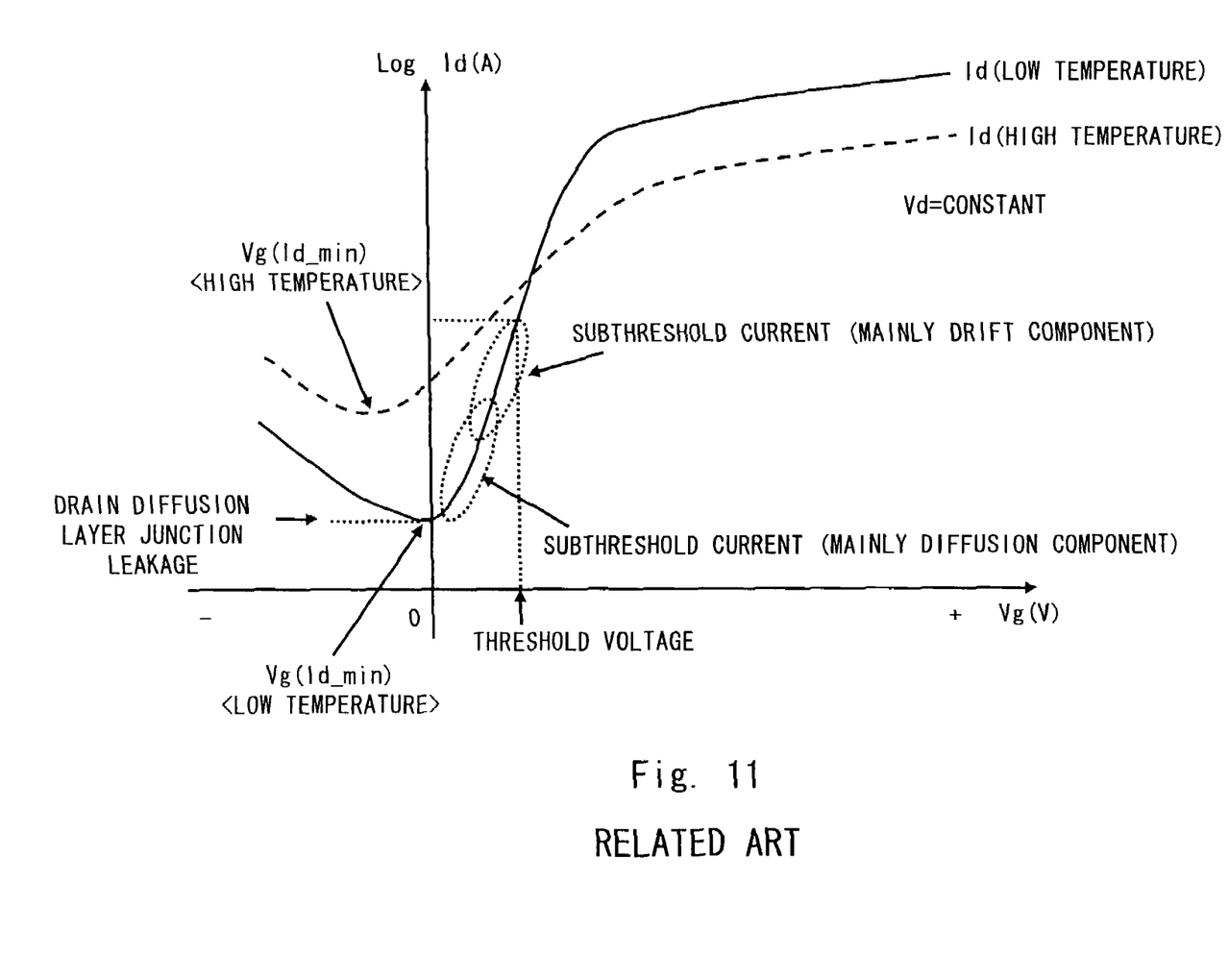
FIG. 11 is a graph showing leakage current characteristics of a gate transistor.

Further, the inventors of the present invention have found by experiment that the leakage current flowing through the gate transistor has temperature characteristics. FIG. 11 shows a graph indicating the leakage current characteristics. As shown in FIG. 11, while the leakage current is minimized when the gate voltage is 0V under low temperature, the leakage current is minimized when the gate voltage is a negative voltage under high temperature. It is thus necessary to control the gate voltage of the gate transistor, which is the charge retention voltage VKK in the above-described related arts, according to temperature in order to minimize the leakage current.

In the memory 100 of the related art 1, it is impossible to control the charge retention voltage VKK because it is fixed to the ground voltage GND. This is because the substrate area P-sub 120 in the lower layer of the word driver area 111 is common to other circuit blocks and therefore changing the voltage can hinder other circuit blocks from operating normally.

In the memory 200 of the related art 2, it is also impossible to control the charge retention voltage VKK independently of the back-gate voltage VBB. This is because the P-well area 224 of the word driver area 211 is integrated with the P-well area 222 of another other cell array 210 and therefore the independent control of the back-gate voltage VBB and the charge retention voltage VKK causes a current to flow from the charge retention voltage VKK to the P-well areas 224 and 222.

SUMMARY OF THE INVENTION

According to one aspect of the present invention, there is provided a semiconductor storage device including a memory cell to store data with a first transistor and a capacitor, and a word driver to control the first transistor with a second transistor and a third transistor connected in series, the semiconductor storage device including a substrate area formed of a semiconductor of a first conductivity type, a first isolation area formed of a semiconductor of a second conductivity type in an upper layer of the substrate area, a first well area where the first transistor is placed, formed of a semiconductor of the first conductivity type in an upper layer of the first isolation area, a second well area where the second transistor is placed, formed of a semiconductor of the first conductivity type in the upper layer of the first isolation area, a third well area where the third transistor is placed, formed of a semiconductor of the second conductivity type in the upper layer of the first isolation area, and a second isolation area formed of a semiconductor of the second conductivity type in the upper layer of the first isolation area, wherein the second well area, the third well area and the second isolation area are formed between two of the first well area, the second isolation area is formed between the second well area and one of the first well areas, and the third well area is formed between the second well area and another one of the first well areas.

According to another aspect of the present invention, there is provided a semiconductor storage device to control a charge accumulated in a capacitor by a gate transistor, including a word driver to apply one of a first voltage to bring the gate transistor into conduction and a second voltage to bring the gate transistor into non-conduction to a word line connected with a control terminal of the gate transistor, a first voltage generator to generate the second voltage to be output from the word driver and a well voltage of a transistor to output the second voltage, and a second voltage generator to generate a well voltage of a well where the gate transistor is placed, wherein the first voltage generator and the second voltage generator respectively output prescribed voltages in accordance with characteristics of the gate transistor, the prescribed voltages controlled independently of each other.

In the semiconductor storage device according to the present invention, the first well area (e.g. a P-well area of a cell array) formed as a well area of the first transistor (e.g. a gate transistor of a memory cell) and the second well area formed as a well area of the second transistor (e.g. an NMOS transistor of the word driver area) are electrically isolated from each other by the first and second isolation areas and the third well area formed of semiconductors of conductivity type. It is thereby possible to control the P-well area of the cell array and the P-well area of the word driver area by voltages independent of each other. Specifically, a back-gate voltage VBB of the transistor of the memory cell and a back-gate voltage VBBK of the NMOS transistor of the word driver can be controlled independently of each other. This enables control of a charge retention voltage VKK independently of the back-gate voltage VBB and setting the charge retention voltage VKK in accordance of the characteristics of the gate transistor.

Further, according to the present invention, the isolation area is placed only on one side of the third well area (e.g. a word driver area), thereby reducing the effect of the isolation area on the chip area compared to the related art 1.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
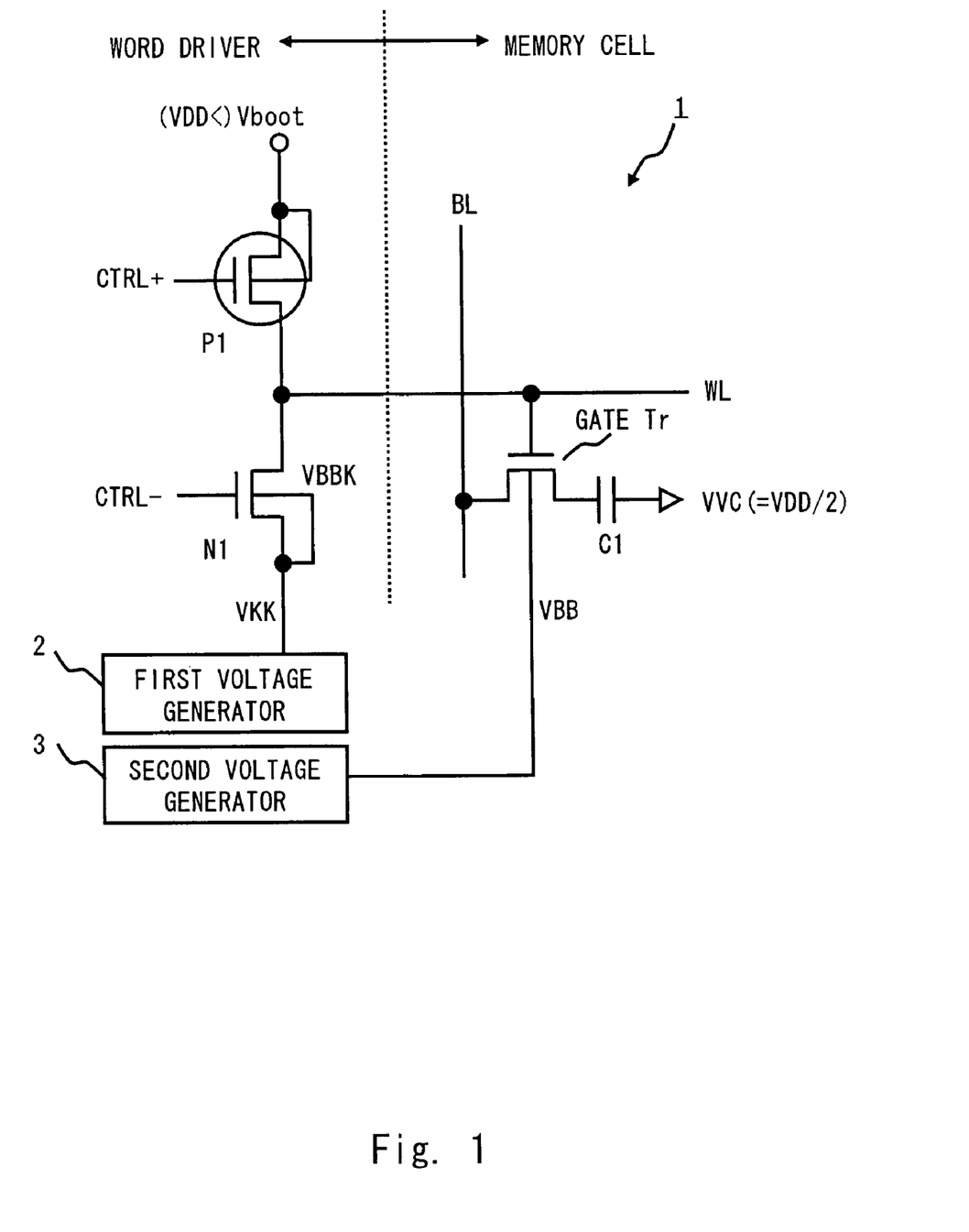
FIG. 1 is a circuit diagram of a memory according to a first embodiment of the present invention.

An exemplary embodiment of the present invention is described hereinafter with reference to the drawings. FIG. 1 shows a circuit diagram of a memory 1 according to a first embodiment of the present invention. As shown in FIG. 1, the memory 1 of the first embodiment includes a first voltage generator 2, a second voltage generator 3, a word driver, and a memory cell.

In the word driver, a PMOS transistor P1 and an NMOS transistor N1 are connected in series between a drive voltage Vboot and a charge retention voltage VKK. Control signals CTRL with opposite logic levels to each other are input to the PMOS transistor P1 and the NMOS transistor N1, respectively. The drain of the PMOS transistor P1 and the drain of the NMOS transistor N1 are connected at a node, to which a word line WL is connected. In response to the control signals CTRL, the word driver supplies the drive voltage Vboot to the word line when writing or reading data and supplies the charge retention voltage VKK to the word line WL when holding data. The drive voltage Vboot may be higher than the power supply voltage VDD, and the charge retention voltage VKK may be a given voltage that is not dependent on a back-gate voltage VBB of a gate transistor of a memory cell or a ground voltage GND. The charge retention voltage VKK is also supplied to a back-gate voltage VBBK of the NMOS transistor N1, and it is output from the first voltage generator 2. The first voltage generator 2 is described in detail later.

The memory cell includes a gate transistor and a capacitor C1. The gate transistor may be an NMOS transistor. The gate of the gate transistor is connected to the word line WL, and the drain is connected to a bit line BL. The source of the gate transistor is connected to a reference voltage VVC (e.g. VDD/2) through the capacitor C1. A back-gate voltage VBB of the gate transistor, which is a voltage of a well where the NMOS transistor is formed, is set to a negative voltage that is lower than the ground voltage GND. The back-gate voltage VBB is output from the second voltage generator 3. The bit line BL is connected to a sense amplifier (not shown), and the charge of the capacitor C1 is output from the sense amplifier through the bit line BL.

Data is written to or read from the memory cell by bringing the gate transistor into conduction according to the voltage of the word line WL. The charges accumulated in the capacitor are maintained by bringing the gate transistor into non-conduction.

The back-gate voltage VBB and the charge retention voltage VKK are described hereinafter. The back-gate voltage VBB and the charge retention voltage VKK are output from the second voltage generator 3 and the first voltage generator 2, respectively. The first voltage generator 2 and the second voltage generator 3 may include a charge pump or the like to output a negative voltage. The back-gate voltage VBB is a back-gate voltage of the gate transistor of the memory cell, and setting the voltage to a negative voltage permits control of a threshold of the transistor. The charge retention voltage VKK is a voltage to bring the gate transistor into non-conduction. It is necessary to change the charge retention voltage VKK with temperature as shown in FIG. 11 in order to minimize the leakage current which flows when the gate transistor is nonconductive. Therefore, the charge retention voltage VKK is controlled independently of the back-gate voltage VBB in this embodiment.

However, because the back-gate voltage VBB and the charge retention voltage VKK are generated by a charge pump or the like, the memory may not operate normally until the operation of the charge pump is stabilized after activating the memory, for example. Thus, in this embodiment, the back-gate voltage VBB and the charge retention voltage VKK are controlled at the same time until the voltages reach a predetermined negative voltage and, after that, the back-gate voltage VBB and the charge retention voltage VKK are controlled independently of each other. Thus, it is preferred for the memory of this embodiment to include a unit of switching the operation of the charge pump or the like when generating the back-gate voltage VBB and the charge retention voltage VKK.

Figure 2:
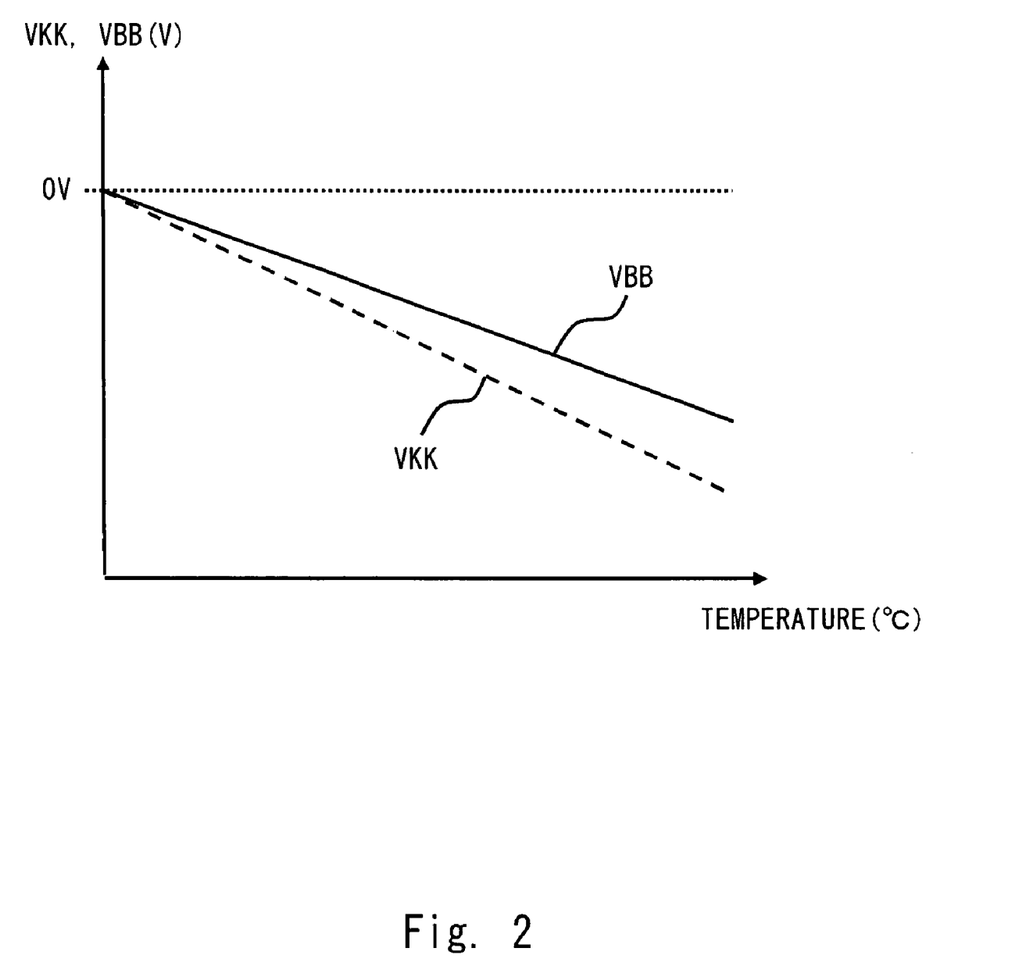
FIG. 2 is a graph indicating a change in a back-gate voltage and a charge retention voltage with temperature according to the first embodiment.

It is more preferred that the absolute values of the back-gate voltage VBB and the charge retention voltage VKK increase as temperature increases. FIG. 2 shows an example of a graph indicating a change in the back-gate voltage VBB and the charge retention voltage VKK with temperature. Even when the back-gate voltage VBB and the charge retention voltage VKK change such that their absolute values increase as temperature increases, they are preferably controlled independently of each other. If the back-gate voltage VBB is excessively low, the field intensity is too high for the cell capacity, which can degrade the charge retention characteristics of the memory cell. Thus, the back-gate voltage VBB is set to an appropriate negative voltage in accordance with the characteristics of the gate transistor under low temperature with low leakage current. On the other hand, if the charge retention voltage VKK is excessively low, it causes leakage current from the PMOS transistor P1 of the word driver to occur. Under low temperature where a threshold voltage of the gate transistor is high, the leakage current can be reduced even when the charge retention voltage VKK is a negative voltage having a small absolute value. Thus, the charge retention voltage VKK is also set to an appropriate negative voltage in accordance with the characteristics of the gate transistor under low temperature.

As described above, the memory 1 of the first embodiment permits independent control of the back-gate voltage VBB and the charge retention voltage VKK. This allows the charge retention voltage VKK to vary with temperature, for example. If the charge retention voltage VKK changes with temperature, it is possible to minimize the leakage current irrespective of temperature, thereby reducing power consumption of the semiconductor device. Further, minimizing the leakage current brings improvement in the charge retention characteristics of the memory cell, thereby reducing power consumption related to the refresh operation.

Furthermore, the ability to independently control the back-gate voltage VBB and the charge retention voltage VKK leads to time reduction for testing of the charge retention characteristics of the memory cell in shipping inspection of the memory, for example. Specifically, it is possible to reduce the charge retention time of the memory cell intentionally by setting the charge retention voltage VKK to be higher than normally used to increase leakage current. This enables the time reduction for testing of the charge retention characteristics of the memory cell.

On the other hand, it is necessary to control the back-gate voltage VBBK of the NMOS transistor N1 and the back-gate voltage VBB of the gate transistor independently of each other in order to mount the memory 1 onto a semiconductor substrate. For example, if the NMOS transistor N1 and the gate transistor are formed on the same well, the back-gate voltage VBBK of the NMOS transistor N1 equals the back-gate voltage VBB of the gate transistor. If the back-gate voltage VBBK of the NMOS transistor N1 is lower than the back-gate voltage VBB of the gate transistor by the amount of a threshold voltage Vth of the transistor or higher, a p-n junction is formed and a current flows from the back gate of the NMOS transistor N1 to the source of the NMOS transistor N1. The layout of the memory 1 of this embodiment is described hereinafter.

Figure 3:
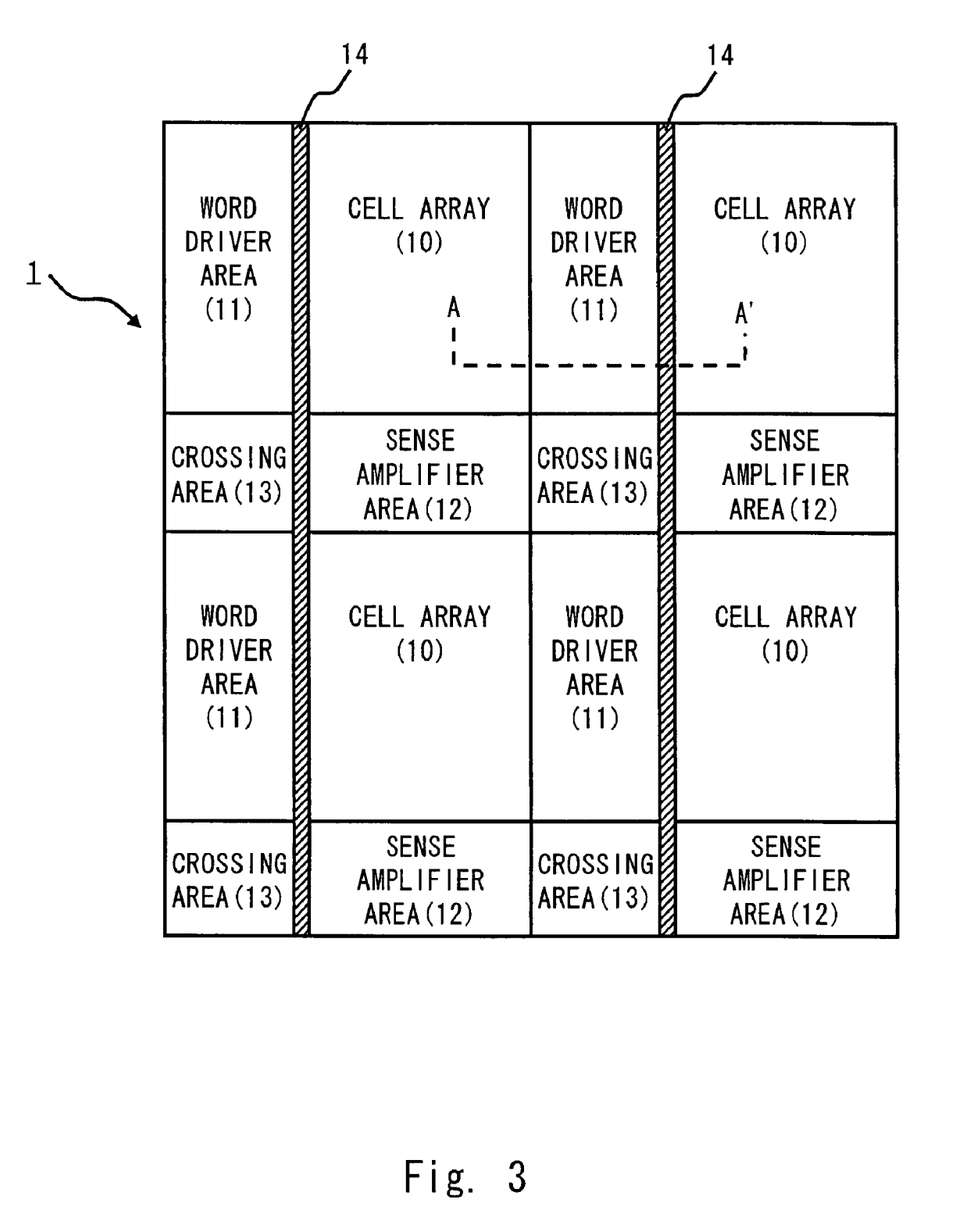
FIG. 3 is a view showing a block layout of the memory according to the first embodiment.

FIG. 3 shows a schematic diagram of the block layout of the memory 1. As shown in FIG. 3, the memory 1 of the first embodiment includes a cell array 10 where a plurality of memory cells are placed, a word driver area 11 where a plurality of word drivers are placed, a sense amplifier area 12 where a plurality of sense amplifiers are placed, and a crossing area 13 where a junction circuit to transfer a control signal from a controller (not shown) to the word drivers and the sense amplifiers is placed. A isolation area 14 is placed between the areas where the cell array 10 and the word driver area 11 are located, and between the areas where the sense amplifier area 12 and the crossing area 13 are located. The cell array 10, the word driver area 11, the sense amplifier area 12 and the crossing area 13 constitute one array set, and the layout of the memory 1 of the first embodiment is such that a plurality of array sets are arranged in a lattice pattern.

Figure 4:
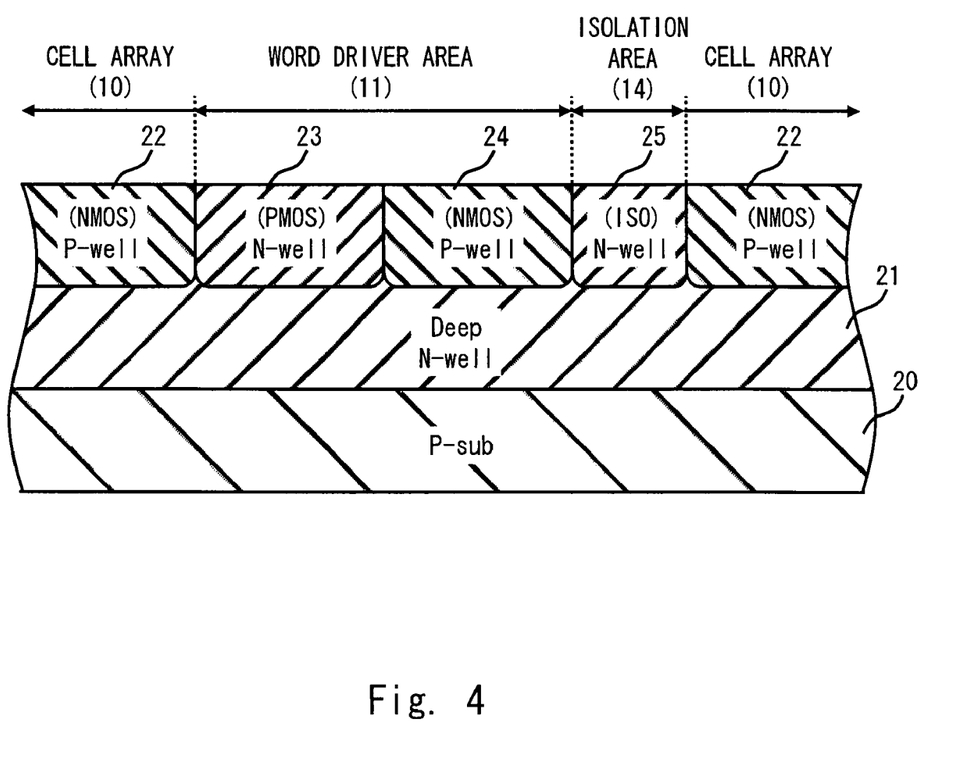
FIG. 4 is a cross-sectional view of the block layout along line A-A' in FIG. 3.

FIG. 4 is a cross-sectional view of the memory 1 along line A-A' in FIG. 3. As shown in FIG. 4, in the memory 1, a first isolation area (e.g. a deep N-well area 21) formed of a semiconductor of a second conductivity type (e.g. an N-type semiconductor) is placed in an upper layer of a substrate area P-sub 20 formed of a semiconductor of a first conductivity type (e.g. a P-type semiconductor). In an upper layer of the deep N-well area 21, a well area where the cell array 10, the word driver area 11, and the isolation area 14 are formed is placed. The cell array 10 includes a first well area (e.g. a P-well area 22) formed of a P-type semiconductor. The P-well area 22 serves as a well area of a first transistor (e.g. a gate transistor of a memory cell).

Between two adjacent cell arrays 10 are formed a second well area (e.g. a P-well area 24) to serve as a well area of a second transistor (e.g. an NMOS transistor of the word driver area 11), a third well area (e.g. an N-well area 23) to serve as a well area of a third transistor (e.g. a PMOS transistor of the word driver area 11), and a second isolation area (e.g. an N-well area 25) to serve as the isolation area 14. The N-well area 25 is placed between the P-well area 24 and the P-well area 22 of one cell array 10, and the N-well area 23 is placed between the P-well area 24 and the P-well area 22 of another cell array 10.

The cross-sectional structure of the sense amplifier area 12 and the crossing area 13, though not shown in drawings, is described hereinafter. The sense amplifier 12 is placed along a side that is substantially perpendicular to the side to which the cell array 10 and the word driver area 11 are adjacent. The sense amplifier 12 is placed in the upper layer of the deep N-well area 21 and includes a fourth well area where an NMOS transistor is formed and which is integrated with the P-well area of the cell array. The sense amplifier 12 is placed between two cell arrays, and the fourth well area of the sense amplifier 12 is isolated into parts, each integrated with the P-well area 22 of an adjacent cell array 10.

The crossing area 13 normally has a smaller circuit size than the word driver 11 or the sense amplifier 12. It is thereby possible to place a isolation area in the vicinity and place a well area inside it, for example. It is also possible in the crossing area 13 to place a well area according to the layout of the adjacent word driver 11 or the sense amplifier 12. The crossing area 13 may be adjacent to two word driver areas 11 and two sense amplifiers 12. The isolation area 14 is placed between the crossing area 13 and one of the adjacent sense amplifiers 12. For example, if the isolation area 14 exists between the word driver area 11 and the cell array 10 corresponding to that word driver 11, the isolation area 14 exists between the crossing area 13 corresponding to that word driver 11 and the sense amplifier 12 corresponding to that cell array 10. The isolation area 14 is thereby laid out linearly, which prevents an increase in chip area.

A voltage applied to each well area is described hereinafter. A voltage applied to the N-well area 23 of the word driver area 11 and the N-well area 25 of the isolation area 14 is higher than the ground voltage, and it is preferably the power supply voltage VDD or the drive voltage Vboot. A voltage applied to the deep N-well area 21 that is adjacent to the N-well area 23 of the word driver area 11 and the N-well area 25 of the isolation area 14 and has the same conductivity type as these areas is the same as the voltage applied to the N-well areas 23 and 25.

On the other hand, a voltage applied to the P-well area 22 of the cell array 10 and the P-well area 24 of the word driver area 11 is lower than the voltage applied to the N-well area 23 of the word driver area 11 and the N-well area 25 of the isolation area 14, and it is preferably the ground voltage or a negative voltage lower than the ground voltage. A voltage applied to the substrate area P-sub 20 is the ground voltage because it serves also as a well voltage of other circuit blocks.

In this condition, a reverse voltage is applied between the area formed of the N-type semiconductor and the area formed of the P-type semiconductor due to the p-n junction, so that no current flows between the area formed of the P-type semiconductor and the area formed of the N-type semiconductor. Thus, the area formed of the P-type semiconductor and the area formed of the N-type semiconductor are insulated from each other.

As described above, according to the first embodiment, the P-well area 22 of the cell array 10 and the P-well area 24 of the word driver area 11 are insulated from each other and further insulated from the substrate area P-sub 20. It is thereby possible to control the voltages applied to the P-well area 22 of the cell array 10 and the P-well area 24 of the word driver area 11 independently of each other. This enables independent control of the back-gate voltage of the NMOS transistor N1 and the back-gate voltage of the gate transistor.

For example, when the back-gate voltage VBB of the gate transistor is a prescribed negative voltage, and the charge retention voltage VKK is lower than the back-gate voltage VBB of the gate transistor, setting the back-gate voltage VBBK of the NMOS transistor N1 to the charge retention voltage VKK prevents formation of a p-n junction from the back gate to the source of the NMOS transistor.

Further, according to this embodiment, the isolation area 14 is placed adjacent only to one of the sides along which the word driver 11 and the cell array 10 are adjacent. Recent high capacity memories that enable high-speed access generally have the layout such that a larger number of smaller cell arrays are arranged. In such a layout, the isolation area affects largely on a chip area. The inventors of the present invention have proved by simulation that the chip area of the memory 1 according to this embodiment increases only by about +1% compared to the memory 200 according to the related art 2. The 1% increase does not substantially present any problem. On the other hand, the chip area of the memory according to the related art 1 increases by about +10% compared to the memory 200 according to the related art 2. The memory of this embodiment enables independent control of the back-gate voltage VBB and the charge retention voltage VKK without substantially increasing the chip area.

The present invention is not limited to the above-described embodiment and may be altered appropriately without departing from the scope and spirit of the invention. For example, the polarity of the semiconductor forming the semiconductor area and each will may be opposite, which produces the same advantages of the present invention as described above. Although N-type semiconductors are used for the first and second isolation areas, the first isolation area (the deep N-well area 21) may be formed of an insulation film with a SOI (Silicon On Insulator) structure, and the second isolation area (the N-well area 25) may have a trench isolation structure where an insulation film is filled in a groove, for example. A control method of generating the back-gate voltage VBB and the charge retention voltage VKK may be altered appropriately according to set values of the voltage.

It is apparent that the present invention is not limited to the above embodiment that may be modified and changed without departing from the scope and spirit of the invention.

What is claimed is:

1. A semiconductor storage device including a memory cell to store data with a first transistor and a capacitor, and a word driver to control the first transistor with a second transistor and a third transistor connected in series, comprising:
   a substrate area formed of a semiconductor of a first conductivity type;
   a first isolation area formed of a semiconductor of a second conductivity type in an upper layer of the substrate area;
   a first well area where the first transistor is placed, formed of a semiconductor of the first conductivity type in an upper layer of the first isolation area;
   a second well area where the second transistor is placed, formed of a semiconductor of the first conductivity type in the upper layer of the first isolation area;
   a third well area where the third transistor is placed, formed of a semiconductor of the second conductivity type in the upper layer of the first isolation area; and
   a second isolation area formed of a semiconductor of the second conductivity type in the upper layer of the first isolation area,
   wherein the second well area, the third well area and the second isolation area are formed between two of the first well area, the second isolation area is formed between the second well area and one of the first well area, and the third well area is formed between the second well area and another one of the first well area.

2. The semiconductor storage device according to claim 1, wherein
   a voltage applied to the second well area is controllable independently of a voltage applied to the first well area.

3. The semiconductor storage device according to claim 1, wherein
   a voltage applied to the second well area varies depending on temperature.

4. The semiconductor storage device according to claim 1, wherein
   a voltage applied to the first well area and the second well area is higher than a voltage of the substrate are and lower than a breakdown withstand voltage between a semiconductor of the first conductivity type and a semiconductor of the second conductivity type.

5. The semiconductor storage device according to claim 1, further comprising:
   a sense amplifier area including a fourth well area adjacent to the first well area and integrated with the first well area to read data stored in the memory cell; and
   a crossing area where a junction circuit to transfer a control signal to the second transistor, the third transistor, and the sense amplifier is formed,
   wherein the second isolation area is formed between the sense amplifier area and the crossing area.

6. A semiconductor storage device including a memory cell to store data with a first transistor and a capacitor, and a word driver to control the first transistor with a second transistor and a third transistor, comprising:
   a substrate area of a first conductivity type;
   a first isolation area of a second conductivity type on the substrate area;
   a first well area of the first conductivity type on the first isolation area where the first transistor is placed;
   a second well area of the first conductivity type on the first isolation area where the second transistor is placed;
   a third well area of the second conductivity type on the first isolation where the third transistor is placed;
   a fourth well area of the first conductivity type on the first isolation area where the first transistor is placed; and
   a second isolation area of the second conductivity type on the first isolation area which isolates the second well area from the fourth well area,
   wherein the third well area is arranged between the first well area and the second well area to isolate each other.

* * * * *